(12) United States Patent
Raphaeli

(10) Patent No.: US 8,928,420 B2
(45) Date of Patent: Jan. 6, 2015

(54) LOW CURRENT SINGLE CHIP OSCILLATOR TIMING CIRCUIT

(76) Inventor: Dan Raphaeli, Kfar Saba (IL)

( * ) Notice: Subject to any disclaimer, the term of this patent is extended or adjusted under 35 U.S.C. 154(b) by 0 days.

(21) Appl. No.: 13/589,097

(22) Filed: Aug. 18, 2012

(65) Prior Publication Data

US 2013/0057353 A1 Mar. 7, 2013

Related U.S. Application Data

(60) Provisional application No. 61/531,633, filed on Sep. 7, 2011.

(51) Int. Cl.
*H03K 4/502* (2006.01)
*H03K 3/033* (2006.01)

(52) U.S. Cl.
CPC ............... *H03K 4/502* (2013.01); *H03K 3/033* (2013.01)
USPC ............................. 331/143; 331/1 R; 331/111

(58) Field of Classification Search
CPC .......... H03L 7/02; H03L 7/00; H03K 3/0231; H03K 3/354; H03K 3/012; H03K 4/08; H03K 4/50; H03K 4/501
USPC ..................... 331/111, 143, 1 R, 34
See application file for complete search history.

(56) References Cited

U.S. PATENT DOCUMENTS

| | | | | |
|---|---|---|---|---|
| 5,543,754 A | * | 8/1996 | Onodera | 331/25 |
| 5,570,067 A | * | 10/1996 | Shacter | 331/111 |
| 5,702,426 A | * | 12/1997 | Pons et al. | 607/27 |
| 6,337,836 B1 | * | 1/2002 | Eidelson | 368/10 |
| 7,123,105 B2 | * | 10/2006 | Kim et al. | 331/66 |
| 7,330,078 B1 | * | 2/2008 | Li et al. | 331/16 |
| 7,498,884 B2 | * | 3/2009 | Kwon et al. | 331/1 R |
| 7,705,685 B2 | * | 4/2010 | Ng et al. | 331/57 |

\* cited by examiner

*Primary Examiner* — Ryan Johnson

(57) ABSTRACT

A low current single chip oscillator timing circuit which includes a dual mode capacitor circuit having a larger capacitance mode and a smaller capacitance mode having a fixed ratio. The timing circuit also includes an oscillator circuit that uses the dual mode capacitor circuit as a part of its time base wherein the large capacitance mode is operated with low power consumption and as needed includes a circuit that generates a reference pulse, wherein the short pulse and the reference pulse are compared and the result is used for correction to the oscillator frequency to create a feedback loop.

21 Claims, 3 Drawing Sheets

LOW CURRENT SINGLE CHIP OSCILLATOR TIMING CIRCUIT

CROSS REFERENCE TO RELATED APPLICATIONS

This application claims priority of U.S. Provisional Patent Application Ser. No. 61/531,633 entitled. "LOW CURRENT SINGLE CHIP OSCILLATOR TIMING CIRCUIT," filed on Sep. 7, 2011.

FIELD OF THE INVENTION

The present invention relates generally to oscillator circuits, and more particularly to a low current single chip oscillator timing circuit.

BACKGROUND OF THE INVENTION

Low speed and low current clock oscillators are widely used in electronics. They provide a time base for real time clocks (RTC's) for keeping the time, timing for periodic operations, etc. They can provide a wakeup signal for devices that are in sleep mode for power saving. In low power operations, if the product is in power saving mode most of the time, the current consumption of the oscillator that must be on all the time is critical. Usually oscillators are based on crystal or RC. Oscillator circuits produce repeating waves of various shapes. Every oscillator has timing components that determine the oscillator's frequency. An RC oscillator uses a resistor and capacitor to perform this function.

Currently available low power oscillators are not fully contained in a standard VLSI chip. They require external components. The crystal oscillator requires at least a crystal and the RC oscillator requires external resistor or capacitor or both. An external resistor or capacitor is needed because the on-chip components are not accurate. Also, it is difficult to produce large on-chip capacitors or large on-chip resistors, and they consume excessive chip surface area.

Calendaring or docketing systems have been devised to track expiration dates of various articles. With the advent of computers, such systems have become more prevalent. However, the data in such systems must be constantly updated and maintained; otherwise the output from such systems becomes unreliable. In some applications, such as pharmacy operations, it would be a tremendous burden to constantly update and maintain a system for tracking expiration dates for every drug in inventory.

As an alternative to calendaring systems, for some time now, the idea has been known that if a label could provide some visual signal that the expiration date has been reached, the burden of monitoring time-sensitive or perishable inventory could be reduced. A timer and storage condition indicator configured as a label to be affixed to a medicine bottle. Once the shelf-life of the medicine in the bottle has expired, the word "Expired" appears on the label.

Many inventors and companies have tried to design such a label. One option was by use of a particular carrier liquid and black dye. The timing function is achieved by a predetermined migration rate of the carrier liquid through a porous material. The disadvantage of this technique or any chemical technique is that it is limited to short time and it is very inaccurate. Moreover, it has to be redesigned for any new duration to measure. Other inventors suggested to use an electronic circuit that will count the time and a LCD screen to show the result. However, no such design was till now made thin enough, flexible enough and cheap enough to be a viable solution.

The technology for manufacturing very thin and flexible batteries or even batteries printed on a label exists. It is also possible to attach a chip to the label and this label can be manufactured in high volumes in low cost. Eidelson, in U.S. Pat. No. 6,337,836, teaches a programmable electronic reminder device for providing a signal at a selectively predetermined date and time includes a programmable real time clock circuit, a thin, sheet-like battery, a light emitting polymer for illuminating a predetermined alert message and a programming interface mounted to a pliant substrate in a layered arrangement. However, Eidelson's device cannot be used to make a practical device, and is not configured for low cost.

It is not desired, however to include any additional external component to the label. It is one of the aspects of the current invention to provide a low power oscillator and is entirely confined inside the chip.

Low power is essential for battery powered devices, such as when the battery is very small, or if the battery is a printed battery. Such batteries may have a power capacity of about 1 mAh. Where the intended lifespan of the device is 5 years, the allowed consumption is 23 nA. It is another aspect of the current invention to provide an oscillator that can reliably operate at such low current consumption, on the order of 10-100 nA.

Transistors are like switches. When turned on, metal-oxide semiconductor (MOS) transistors allow the current to flow through them and when turned off do not allow current to flow through them. The current is controlled by the VGS voltage and there is a voltage threshold, such that if VGS is larger than the threshold voltage the current is flowing and if VGS is far below the threshold the current is shut off. In case the controlling voltage is slightly below the threshold, the transistor is not shut off entirely and a very small current is flowing. The operation of the transistor is the sub-threshold region is highly dependent on the temperature, the process and the layout and is susceptible to noise. Therefore, without continuous online calibration, a current source in the subthreshold region is highly inaccurate.

When the resistor and capacitor are small, the time constant is short and the oscillator must operate at high frequency, hence drawing a lot of power. Furthermore, the current drawn by the oscillator is on the order of VDD/R. Since the largest reasonable on-chip resistor is 1 Mohm, the minimum current drawn by on chip RC oscillator will be a few uA's.

Kwon, in U.S. Pat. No. 7,498,884, teaches a self calibrating RC oscillator. This oscillator contains an RC oscillator and a ramp circuit, and a close loop circuit to control the frequency of the RC oscillator according to the ramp circuit. The ramp circuit, in turn is controlled by a resistor and capacitor. The resistor is temperature stable and the capacitor can be trimmed by switches such that the oscillation frequency is equal to a reference crystal oscillator.

Ng et al in U.S. Pat. No. 7,705,685 teaches a low voltage oscillator with capacitor ratio selectable duty cycle. This oscillator is using MOS transistors in their sub-threshold mode it is designed to be able to work in low voltage and the capacitor ratio is used for duty cycle selection. However, Ng device does not teach how to use capacitor ratio to provide low current operation with stable frequency and current consumption.

SUMMARY OF THE INVENTION

Accordingly, it is a principle object of the present invention to provide an oscillator circuit with much lower current consumption, on the order of 10 nA.

It is another principle object of the present invention to provide an oscillator circuit at much lower cost.

It is another principle object of the present invention to provide an on chip oscillator circuit consuming very low chip area without a need for a connection to external devices It is one other principle object of the present invention to provide an oscillator circuit for use with real time clocks (RTC's) for keeping the time, timing for periodic operations, etc.

It is yet one other principle object of the present invention to provide a wakeup signal for devices that are in sleep mode for power saving.

It is still one other principle object of the present invention to enable low power operations, wherein if the product is in power saving mode most of the time, the current consumption of the oscillator that must be on all the time.

It is one further principle object of the present invention to provide a signal (visual or other) for devices for patients to remind them of the time to take medicine or a signal (visual or other) to notify patients or health care workers that the medicine expiration date has passed.

The present invention provides a low current single chip oscillator timing circuit, which includes a dual mode time base circuit having a long period and a short period, and the ratio between the long period and the short period is stable. Whenever the oscillator frequency is tuned, the long period tracks the short period such that their ratio stays fixed as much as possible. Whenever the oscillator is in the long time base mode it consumes very low power. Occasionally or periodically or as needed the oscillator is configured in the short time base mode and generates a short period. The short period is compared to a reference duration generated by a reference circuit. A calibration circuit or a feedback circuit is used to correct the short period until it is equal to the reference duration. The short period then tracks the reference circuit. As long as the reference circuit is accurate so is the short oscillator period. The long oscillator period is then tracking also the reference circuit since the ratio between the long period and short period is fixed.

In one embodiment of the present invention, the dual mode time base comprises a dual mode capacitor circuit having a larger capacitance mode and a smaller capacitance mode with a fixed ratio. The timing circuit also includes an oscillator circuit that uses the dual mode capacitor circuit as a part of its time base wherein the large capacitance mode is operated with low power consumption. The circuit further includes a reference pulse generator. Occasionally periodically or as needed, the capacitor is configured in the small capacitance mode and the oscillator generates a short pulse. The reference pulse is triggered at the start of the short pulse, wherein the short pulse and the reference pulse are compared and the result is used for correction to the oscillator frequency to create a feedback loop. When the feedback loop is locked, the oscillator long period tracks the reference pulse.

In an exemplary embodiment of the present invention a voltage controlled current source is charging a capacitor that can change mode by a switch. In one mode the capacitance is large, so charging time is large. In the alternate mode the capacitance is small, so the charging time is short. The same current charges the capacitor in both modes, so the time ratio is equal to the capacitance ratio. Most of the time large capacitance mode is operated with very little power consumption. The source of the very small current of a few nA is provided by a metal-oxide-semiconductor (MOS) transistor in the sub-threshold region. Left alone, the current source may drift, leading to a very inaccurate oscillator. A few mv change in the gate voltage or a temperature change can cause the current source to source much higher current leading to higher current consumption of the oscillator, or alternatively it can cause the current source to source much lower current causing the oscillator to oscillate very slowly or to stop oscillating.

Therefore occasionally, or as needed, the dual mode capacitor is switched to the small capacitance mode so that a short pulse is produced. In conjunction with the short pulse a reference short pulse is generated by a standard mono-stable reference circuit.

The current consumption of the reference circuit is relatively large, but it is operated only a small part of the time. The short pulse to be measured and the mono-stable pulse are compared using a standard phase comparator. The output of the phase comparator closes a loop with the current source to fix the current such that the measured and reference pulse currents are equal. Thus, the frequency of the oscillator will be fixed, since the ratio between the short charging time and the long charging time is fixed by the ratio between the capacitance of the two modes.

The reference circuit pulse duration is mostly determined by its own resistances and capacitances and the accuracy of the whole oscillator depends on the accuracy of the reference oscillator. Better accuracy and stability in temperature can be obtained. The resistor can be made temperature stable by using a combination of two materials with opposite temperature dependence and the capacitor can be trimmed by switches at the initial activation such that the oscillation frequency is equal to a reference oscillator.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

For a better understanding of the invention with regard to the embodiments thereof, reference is now made to the accompanying drawings, in which like numerals designate corresponding elements or sections throughout, and in which.

DETAILED DESCRIPTION OF THE CIRCUIT

Figure 1:
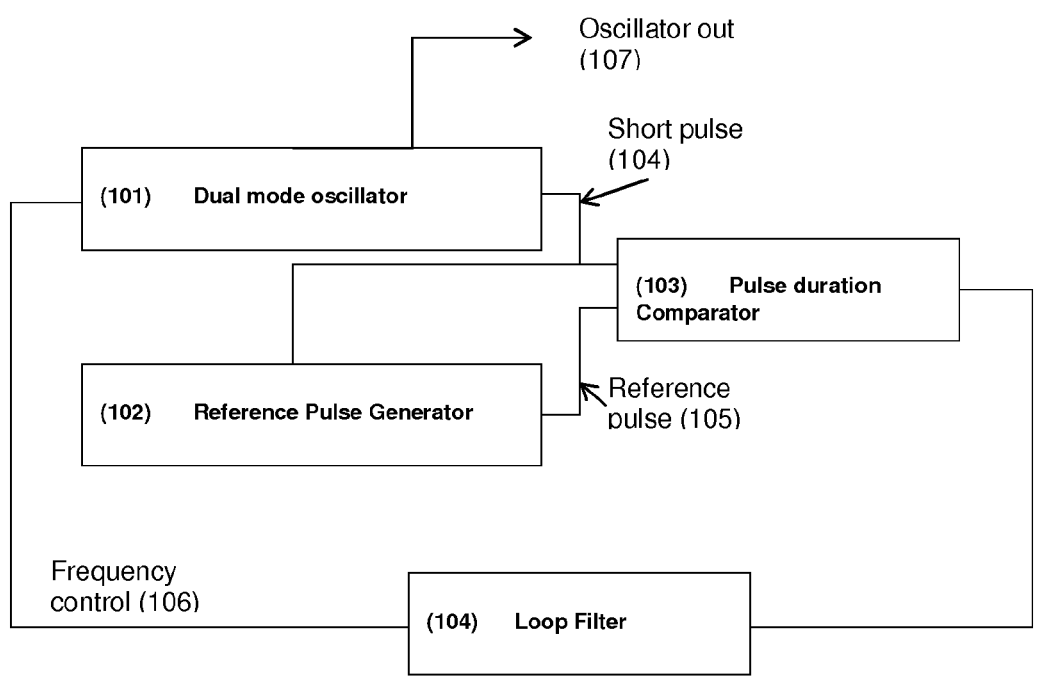
FIG. 1 is a general block diagram of a low current single chip oscillator, constructed in accordance with the principles of the present invention.

FIG. 1 is a general block diagram of a low current single chip oscillator, constructed in accordance with the principles of the present invention. A dual mode voltage controlled oscillator 101 is outputting some clock signal at its output 107. In most of the time the output 107 is a slow clock made according to a long time constant circuit. Occasionally or periodically, the oscillator 101 is configured in a long time constant mode and is generating a short pulse 104. The short pulse 104 is also triggering a reference pulse generator 102 which generates a reference pulse 105. It is preferred that the short pulse will occur after a fixed number of long periods. Therewise, the average oscillator clock frequency at the output will be lower by a small deterministic number. An example showing how to calculate this number will be given in a more detailed exemplary embodiment. A pulse duration comparator 103 compares the short pulse 104 and the reference pulse 105, to test which one is longer. The output of the pulse comparing circuit is fed to a loop filter 104 which outputs a control voltage 106 to control the frequency of the oscillator. The loop filter creates a negative feedback control loop which causes the short pulse to track the reference pulse, and since the oscillator frequency is a constant factor relative to the short pulse duration, the frequency is determined by the reference pulse accuracy.

Figure 2:
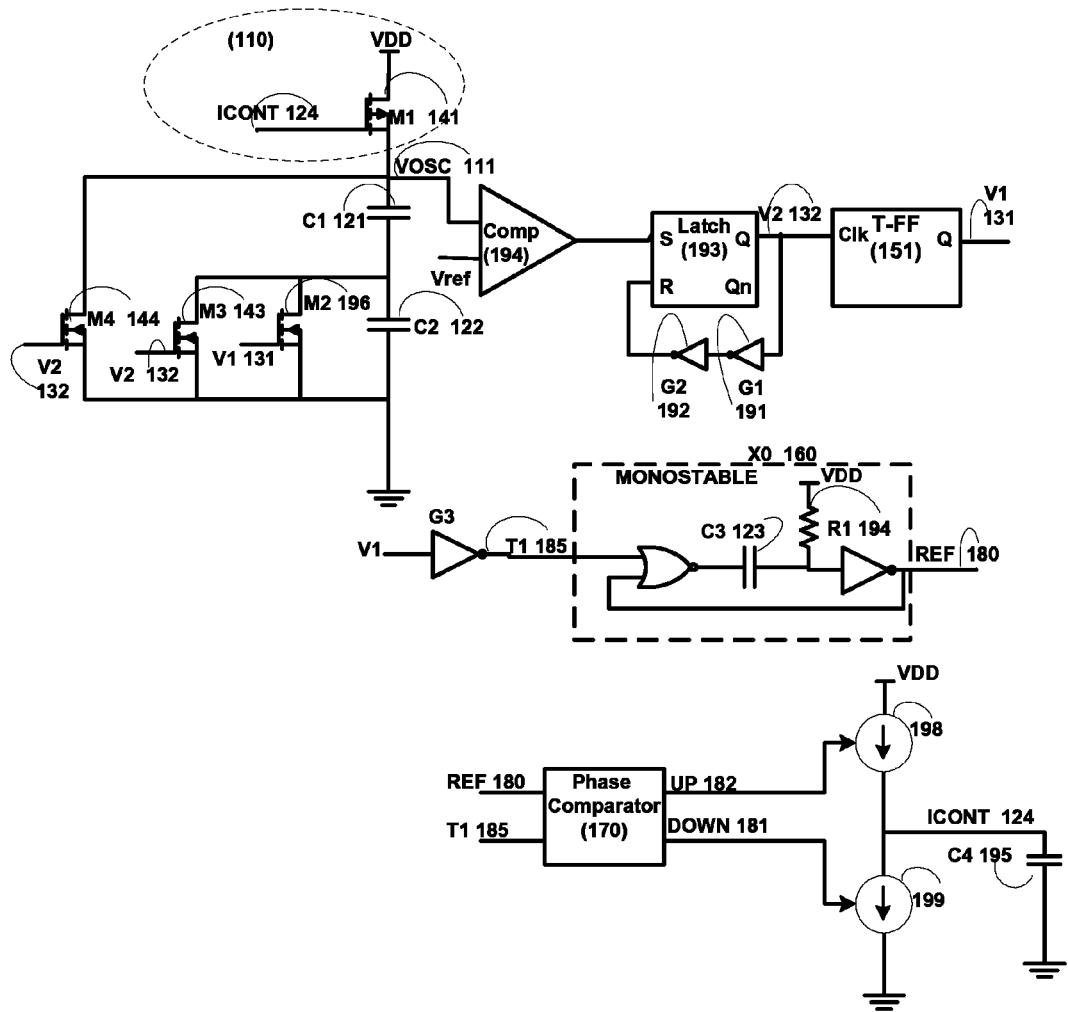
FIG. 2 is a detailed circuit diagram of a low current single chip oscillator, constructed in accordance with the principles of the present invention.

FIG. 2 is a detailed circuit diagram of a low current single chip oscillator, constructed in accordance with the principles of the present invention. Voltage controlled current source implemented by the PMOS transistor M1 141 is charging a series of two capacitors C1 121 and C2 122, where C1>C2. The ratio between C1 121 and C2 122 is N. A digital control voltage V1 controls the capacitors circuit. If V1 131 is 0V, C1 121 and C2 122 are in series resulting in a capacitance of C2*N/(1+N). If V1 131 is VDD, then C2 122 is shorted by transistor M2 196, so that the equivalent capacitance is C1=C2*N. The ratio between the two modes is 1+N.

In one mode the equivalent capacitor is large so the charging time is large and in the alternate mode the capacitor is small so the charging time is short. The same current is charging the capacitor in the two modes, so the time ratio is equal to the capacitor ratio. Most of the time, the large capacitance mode operates with very little power consumption. The very small current source used, of a few nA, is produced by PMOS transistor M1 141 placed in the sub-threshold region.

Figure 3:
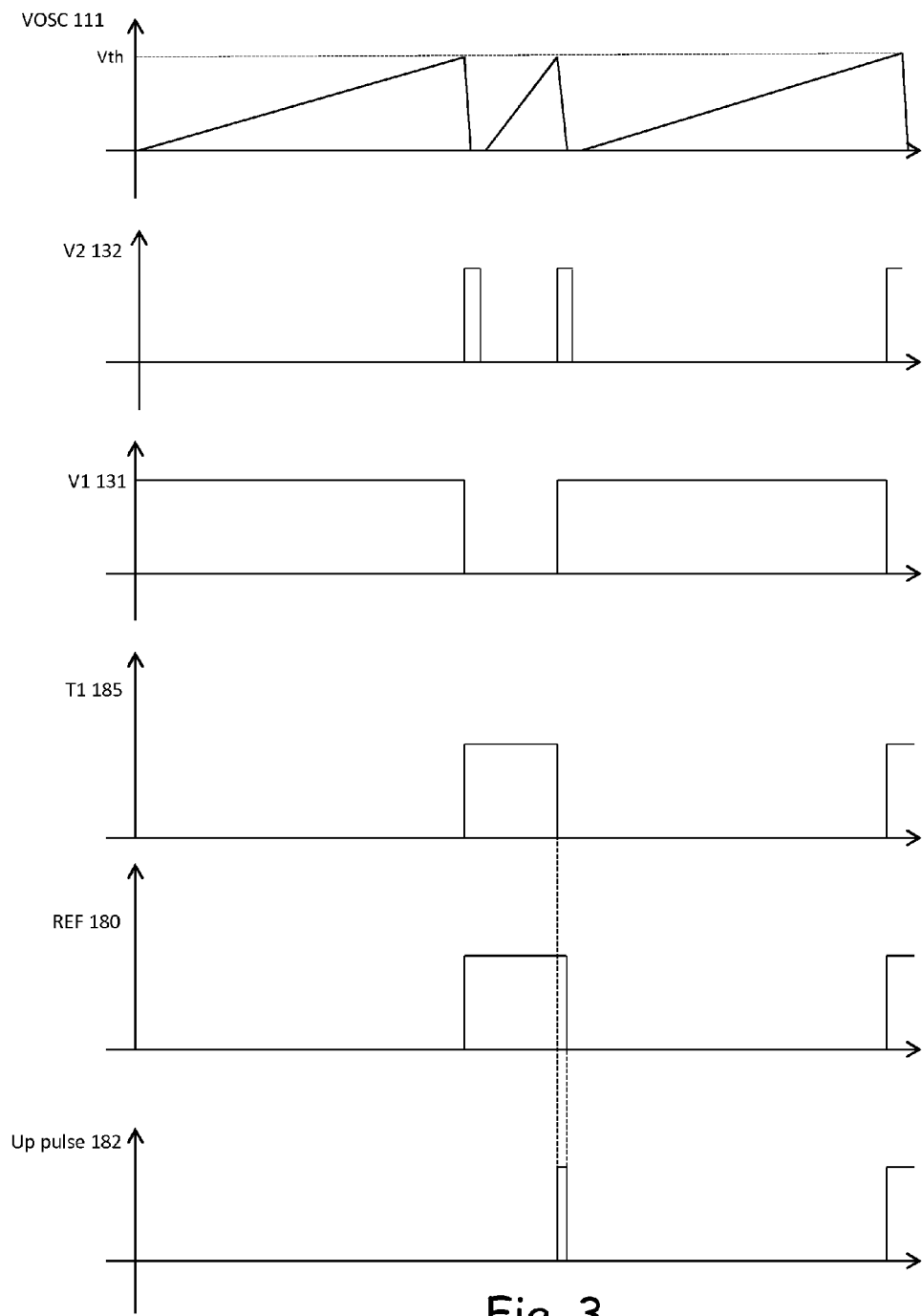
FIG. 3 is a schematic waveform showing the operation of the circuit diagram of FIG. 2.

Left alone, the current source may drift resulting in a very inaccurate oscillator. Therefore, occasionally, or as needed, the variable capacitor is switched to the small capacitance mode and a short pulse is produced. In the exemplary embodiment shown in FIG. 2 a short pulse is generated every time the long charging time ends. The circuit alternates between a short charging time and a long charging time. The operation of the exemplary embodiment shown in FIG. 2 is also explained with the schematic waveform plot shown in FIG. 3. Note that the time durations in FIG. 3 are not to scale, for better readability: The pulse duration in V2 is typically much shorter, and the ratio between the long ramp and the short ramp is typically much higher.

V1 131 is the output of a toggle flip-flop (T-FF) 151, so its value can be either 0 or VDD and is toggling between these two states. Let us assume that V1 131=VDD and the oscillator voltage (VOSC) 111=0. Capacitor C1 121 is charged slowly until VOSC 111=$V_{th}$, where $V_{th}$ is a constant voltage. Then the comparator 194 outputs logic '1' and the latch 193 is set. Then V2 132=VDD and C1 121 is reset by the transistor M4 144. After a short delay provided by the two NOT gates G1 191 and G2 192, latch 193 is reset and the circuit is ready for the next phase.

The pulse V2 132 is further connected to the T-FF 151 which toggles its output V1 131. Now V1 131=0 and the charging time is fast. Again, when VOSC 111 reaches $V_{th}$ comparator 194 sets latch 193 and sets V2 132=1 for a short pulse. V2 132 resets both C1 121 and C2 122 using M3 143 and M4 144. The falling edge of V1 131 triggers the mono-stable XO 160 to generate the reference pulse 180. The reference circuit pulse duration is determined by R1 194 and C3 123. The current consumption of the reference circuit is relatively large, but it is operated only a small part of the time. For example if the ratio N is 100 the larger power consumption should be multiplied by 1% to find its effect on the total average power.

The short pulse T1 185 to be measured and the reference pulse 180 are compared using a standard phase comparator 170. Phase comparator 170 tests which pulse is wider by testing which pulse ended earlier. If reference pulse 180 ended earlier a down pulse 181 is generated. If reference pulse 180 ended later, an up pulse 182 is generated. Up pulse 182 and down pulse 181 charge or discharge a capacitor C4 195 using the current sources 198 and 199, respectively. The capacitor voltage ICONT 124 determines the current of the current source.

For example, if reference pulse 180 is shorter than the measured pulse T1 185, a down pulse 181 will be generated. Down pulse 181 will activate current source 199 and decrease the voltage on capacitor ICONT 124 slightly, and then the current from current source M1 141 will be increased, leading to a shorter period in both the long and short modes.

The resulting frequency of the oscillator is now a function of the duration of the reference pulse. Ignoring the influence of the very short reset signal R2, each cycle is composed of a long ramp of duration N*T and a short ramp of duration T where T is the length of the reference pulse which is now, if the loop converges, equal the short ramp time.

The accuracy of the threshold voltage and the offset of the comparator 194 are not important due to the tuning to the reference pulse. Therefore, in an exemplary embodiment, the true comparator is replaced (to save power) with one NMOS transistor which starts to conduct whenever the voltage at its gate is above its threshold (Vth in FIG. 2=transistor's Vth). Its drain drop to 0V and is configured to set the latch 193. Some circuit has to be used to reset its drain to VDD afterwards. For example, a PMOS transistor with its gate connected to a delayed version of Qn of latch 193 can restore the drain voltage. Another simple arrangement is a PMOS transistor with its gate connected to VOSC, but the NMOS and PMOS has to have a large threshold voltage so that there will be no conductance of both PMOS and NMOS at the same time.

In an alternative embodiment, the dual mode time constant circuit is generated by a dual mode current source circuit that charges a capacitor. In the larger current mode the charging time is short and in the low current mode the charging time is long. A constant ratio between the current modes insures constant ratio between the pulse durations. Such a constant ratio can be obtained by a current mirror circuit as known in the art using ratio between transistors.

The reference mono-stable pulse duration depends among others on a value of a resistor and a capacitor, and on chip they are not accurate, and a standard resistor is temperature dependent. Since the accuracy of the whole oscillator depends on the accuracy of the reference pulse, it is advantageous to calibrate the reference pulse in first use or whenever a more stable reference is available, for example a crystal oscillator that is normally off. The accurate oscillator is used to calibrate the length of the reference pulse, and the calibration can be done, for example, by switching on or off a an array of switches connected to array of capacitors as known in the art (see for example U.S. Pat. No. 7,498,884). The resistor can be produced in a way that is more resistant to temperature change, as known in the art, for example by using one resistor with positive temperature dependence combined with one resistor with negative temperature dependence.

The implementation of the reference mono-stable in FIG. 2 is only an example. There are many other known implementations of mono-stable. An exemplary alternative embodiment of a reference pulse generator will use an accurate current source produced by a band-gap reference circuit that charges a capacitor, and the capacitor is calibrated in first time use by an array of switches and capacitors. Such circuit may require also a voltage band-gap reference to compare the voltage of the ramp to an accurate value. It is important that the reference pulse generator standby current will be very low. In some other exemplary embodiments, he reference pulse is generated by using a higher frequency oscillator and a counter that counts several cycles to produce a time duration equal to the desired duration of the oscillator in the short pulse mode.

Having described the invention with regard to certain specific embodiments thereof, it is to be understood that the description is not meant as a limitation, since further embodiments and modifications will now become apparent to those skilled in the art, and it is intended to cover such modifications as fall within the scope of the appended claims.

What is claimed is:

1. A low current single chip oscillator timing circuit comprising:
    a dual mode time constant circuit having a large time constant mode and a small time constant mode with a fixed ratio between them,
    an oscillator circuit that uses the dual mode time constant circuit as a part of its time base, wherein the large time constant mode is operated with low power consumption and is generating long period, and the small time constant mode generating short period,
    a reference circuit that generates a reference duration, occasionally or periodically, in conjunction with the short period; and
    a timing circuit that compares the reference duration and the short period, wherein the result is used for correction to the oscillator frequency of the oscillator circuit.

2. The low current single chip oscillator timing circuit of claim 1, wherein the dual mode time constant circuit is generated by a dual mode capacitor circuit having a larger capacitance mode and a smaller capacitance mode, wherein the capacitance of the two modes has a fixed ratio.

3. The low current single chip oscillator timing circuit of claim 1, where the dual mode time constant circuit is generated by a dual mode current source circuit and a capacitor having a larger current mode with a short charging time and a smaller current mode with a long charging time, wherein the current of the two modes has a fixed ratio.

4. The low current single chip oscillator timing circuit of claim 2, wherein the dual mode time constant circuit further comprises a current source that charges the capacitor.

5. The low current single chip oscillator timing circuit of claim 3, where the oscillator frequency is tuned by controlling the dual mode current source.

6. The low current single chip oscillator timing circuit of claim 4, where the oscillator frequency is tuned by controlling the current source.

7. The low current single chip oscillator timing circuit of claim 1, wherein the dual mode time constant circuit further comprising a current source, wherein the current source provides a current of significantly less than 1 uA.

8. The low current single chip oscillator timing circuit of claim 4, wherein the same current charges the capacitor circuit in both modes, and wherein the charging time in smaller capacitance mode is fast, so the fixed ratio is equal to the capacitance ratio.

9. The low current single chip oscillator timing circuit of claim 1, wherein the reference circuit is a mono-stable circuit.

10. The low current single chip oscillator timing circuit of claim 9, wherein the mono-stable circuit pulse duration is based on the value of one or more resistors and one or more capacitors.

11. The low current single chip oscillator timing circuit of claim 10, wherein the pulse duration is calibrated by an array of switches and capacitors.

12. The low current single chip oscillator timing circuit of claim 4, wherein the current source is provided by a metal-oxide-semiconductor (MOS) transistor in the sub-threshold region.

13. The low current single chip oscillator timing circuit of claim 1, wherein the reference pulse configuration is a higher frequency oscillator and a counter.

14. The low current single chip oscillator timing circuit of claim 1, wherein a power source of the low current single chip oscillator timing circuit is a thin flexible battery.

15. The low current single chip oscillator timing circuit of claim 7, wherein the oscillator is implemented on a single chip with no external components.

16. The low current single chip oscillator timing circuit of claim 14, wherein the battery is printed on a label.

17. The low current single chip oscillator timing circuit of claim 4, wherein the capacitor voltage is compared with a constant voltage using a comparator.

18. The low current single chip oscillator timing circuit of claim 4, wherein the capacitor voltage is compared with a constant voltage using a MOS transistor.

19. A low current single chip oscillator timing circuit comprising:
    a dual mode time constant circuit having a large time constant mode and a small time constant mode with a fixed ratio between them,
    an oscillator circuit that uses the dual mode time constant circuit as a part of its time base, wherein the large time constant mode is operated with low power consumption and is generating long period, and the small time constant mode generating short period,
    a reference circuit that generates a reference duration, occasionally or periodically; and
    a timing circuit that compares the reference duration and the short period, wherein the result is used for correction to the oscillator frequency of the oscillator circuit, and wherein the timing circuit that compares the reference circuit and the short oscillator period is a phase comparator, and the reference circuit is triggered at the start of the short oscillator period.

20. The low current single chip oscillator timing circuit of claim 19, wherein the circuit that generates a reference time base is a mono-stable circuit which generates a reference pulse, the oscillator in the small time constant mode is generating a short pulse during the short period; the phase comparator provides an output signal relative to the time difference between the end of the reference pulse and the end of the short pulse.

21. The low current single chip oscillator timing circuit of claim 20, wherein the output signal of the phase comparator is controlling the oscillator frequency in a feedback loop such that the oscillator short period is tracking the reference.

* * * * *